United States Patent [19]
Delhaye et al.

[11] Patent Number: 5,130,763
[45] Date of Patent: Jul. 14, 1992

[54] INTEGRATED SEMICONDUCTOR DEVICE WITH AN INSULATED-GATE FIELD EFFECT TRANSISTOR HAVING A NEGATIVE TRANSCONDUCTANCE ZONE

[75] Inventors: Etienne Delhaye, Nandy; Michel Wolny, Grigny; Thierry Aguila, Fontenay-sous-Bois; Ramesh Pyndiah, Valenton, all of France

[73] Assignee: U.S. Philips Corp., New York, N.Y.

[21] Appl. No.: 467,625

[22] Filed: Jan. 19, 1990

[30] Foreign Application Priority Data

Jan. 24, 1989 [FR] France .................. 89 00809
Jan. 24, 1989 [FR] France .................. 89 00810

[51] Int. Cl.$^5$ .............. H01L 27/12; H01L 29/90; H01L 29/161; H01L 29/80
[52] U.S. Cl. ........................... 357/22; 357/4; 357/13; 357/16
[58] Field of Search .............. 357/22; 357/4, 13, 16, 357/22

[56] References Cited

U.S. PATENT DOCUMENTS

| | | | |
|---|---|---|---|
| 4,027,179 | 7/1981 | Yokoyama et al. | 357/16 |
| 4,366,493 | 12/1982 | Braslau et al | 357/22 |
| 4,605,912 | 8/1986 | Naster et al | 357/23.14 |
| 4,636,823 | 1/1987 | Margalet et al. | 357/16 |
| 4,724,342 | 2/1988 | Sato | 307/304 |
| 4,786,957 | 11/1988 | Muto | 357/16 |
| 4,788,579 | 11/1988 | Couch et al. | 357/4 |
| 4,806,998 | 2/1989 | Vinter et al. | 357/4 |
| 4,885,623 | 12/1989 | Holm-Kennedy et al. | 357/23.1 |
| 5,021,841 | 7/1991 | Leburton et al. | 357/13 |
| 5,027,179 | 7/1991 | Yokoyama et al | 357/16 |

OTHER PUBLICATIONS

M. Wolny et al., "High -Performance WN-Gate MISFETs Fabricated from MOVPE Wafers," *Electronics Letters*, (Oct. 8, 1987) vol. 23 pp. 1127–1128.

M. S. Shur et al., "New Negative Resistance Regime of Heterostrucure Insulated Gate Transistor (HIGFET) Operation," *IEEE Electron Device Letters*, vol. EDL-7 (Feb. 1986) pp. 78–80.

N. Yokoyama et al., "A New Functional, Resonant-Tunneling Hot Electron Transistor (RHET)," *Japanese Journal of Applied Physics*, vol. 24 (Nov. 1984) pp. L853–L854.

*Primary Examiner*—J. Carroll
*Attorney, Agent, or Firm*—Steven R. Biren

[57] ABSTRACT

An integrated semiconductor device, including an insulated-gate field effect transistor biased to a constant level, has a drain-source current characteristic as a function of the gate-source voltage which exhibits a negative transconductance zone beyond a maximum, the slopes of the characteristic on both sides thereof being substantially symmetrical so that two values of the gate-source voltage which are symmetrical with respect to said maximum correspond substantially to the same value of the drain source current, and in that the transistor comprises biasing means ensuring that its operating zone is situated in the region of said characteristic around said maximum.

11 Claims, 5 Drawing Sheets

(F=500 kHz)

INTEGRATED SEMICONDUCTOR DEVICE WITH AN INSULATED-GATE FIELD EFFECT TRANSISTOR HAVING A NEGATIVE TRANSCONDUCTANCE ZONE

BACKGROUND OF THE INVENTION

The invention relates to an integrated semiconductor device, including an insulated-gate field effect transistor biased to a constant level.

The invention is used for the manufacture of digital or analog circuits, for example an exclusive-NOR circuit, a frequency doubler circuit, a phase modulator circuit, a 0°-180° phase shifter circuit.

The properties of an insulated gate field effect transistor are known, for example from the publication "New Negative Resistance Regime of Heterostructure Insulated Gate Transistor Operation" by Michaël F. SHUR et al, in "IEEE Electron Device Letters, Vol. EDL-7, No. 2, Feb. 1986".

This document describes the negative differential drain resistance effect which appears in a field-effect transistor comprising an N-type conduction channel with a GaAs-GaAlAs heterostructure and an insulated gate which is constantly biased to a high level.

The structure of this so-called HIGFET transistor comprises a non-intentionally doped GaAs layer having a thickness of 0.5 µm which is realized on a semi-insulating GaAs substrate, followed by a non-intentionally doped GaAlAs layer which serves as a gate insulating layer on which a gate contact of WSi is realized. Source and drain regions are defined on either side of the gate by localized implantation of Si ions for the N-regions or Mg ions for the P regions. The ohmic contacts on these regions are formed by Au—Ge—Ni metallizations when the regions are of the N-type. The device is insulated by proton implantation. The gate has a length of 1.3 µm and a width of 10 µm.

At a fixed gate-source voltage of high value (approximately 3 V) in this device a decrease of the drain-source current occurs when the drain-source voltage changes from 0.8 to 1.25 V. Subsequently, at the same fixed gate-source voltage the drain-source current increases when the drain-source voltage changes from 1.25 V to higher values. These variations of the drain-source current as a function of the drain-source voltage at a constant and high gate-source voltage thus lead to the appearance of a negative drain resistance in saturation. This effect is due to a spatial transfer of the carriers in the channel which are collected by the gate.

The cited document does not describe any application of the negative drain resistance effect and does not reveal either that when such a transistor is used in given circumstances involving exact biasing, other interesting effects can also exist, notably a negative transconductance effect. Notably, the application of the latter effect is by no means mentioned. It is known, however, from the applications of a bipolar quantum-well transistor, referred to as a resonant hot electron transistor.

These applications of such a transistor are known, for example from the publication "A New Functional Resonant-tunneling Hot Electron Transistor" by NAOKI YOKOYAMA et al in "Japanese Journal of Applied Physics, Vol. 24, no. 11, Nov. 1985, pp. L853, L854". European Patent Application EP 0 225 698 deals with exactly the same subject.

One of said latter publications describes first of all a bipolar transistor with a quantum well disposed between the base and the emitter. This so-called resonant hot electron transistor is formed by a collector layer, a collector barrier layer, a base layer with a base contact, and a part which serves for the formation of a quantum-well which comprises an alternation of GaAlAs/GaAs layers, each of which has a thickness in the order of 50 Å (5 nm), an emitter layer and an emitter contact. The collector contact is realized on the rear surface of the collector layer.

The quantum well between the base and the emitter has discrete carrier energy levels. By changing the emitter-base biasing, the energy of the levels of the well can be made equal to the lower side of the conduction band of the emitter material. According to this method the current characteristic as a function of the voltage of the base-emitter junction exhibits a peak followed by a discontinuity.

The cited publications teach that either an exclusive-NOR gate or a frequency multiplier circuit can be realized by means of such a transistor.

However, the type of transistor used for realizing such circuits has various drawbacks, such as:
first of all, it is extremely difficult to realize, it being notably difficult for the manufacturer of integrated circuits to realize several layers which are as thin as 5 nm and which are necessary for realizing the quantum well;
moreover, the proposed circuits operate only at a temperature of 77° K., which is a major drawback for the large scale applications envisaged, for example in the field of television;
furthermore, in one application the frequency multiplication is realized by biasing the device around its current peak. Because the latter is followed by a discontinuity, an abrupt transition appears in the output signal, giving rise to a spectrum containing many higher harmonics. Therefore, if a purer signal is to be obtained, it is absolutely necessary to filter this signal before it can be used (see notably the publication in the Japanese Journal of Applied Physics);
generally speaking, the presence of the discontinuity in the characteristic of the base current as a function of the base-emitter voltage due to the discrete energy levels leads to instabilities.

SUMMARY OF THE INVENTION

In accordance with the invention, these drawbacks are avoided by means of a circuit as described above, characterized in that the insulated gate field effect transistor has a drain-source current characteristic as a function of the gate source voltage which exhibits a negative transconductance zone beyond a maximum, the slopes of the characteristic on both sides thereof being substantially symmetrical so that two values of the gate source voltage which are symmetrical with respect to said maximum correspond substantially to the same value of the drain-source current, and in that the transistor comprises biasing means ensuring that its operating zone is situated in the region of said characteristic around said maximum.

This transconductance effect of the insulated gate field effect transistor, exhibiting a maximum of which the slopes at both sides are substantially symmetrical, the slope beyond the maximum corresponding to a negative transconductance zone, is not disclosed in the cited documents.

The symmetry around the maximum (first derivative equals zero) enables a single drain-source current value to be obtained for two symmetrical values of the gate-source voltage on both sides of the maximum.

This effect enables many applications whose principal advantages reside in the simplicity of the realization of the transistor, the possibility of operation at temperature of its environment, the stability of the output signals, and the simplicity of the circuits themselves.

One embodiment of this device is characterized in that the means for biasing the insulated-gate field effect transistor include the direct connection of the source of the transistor to ground, the connection of the drain of the transistor to a fixed, positive d.c. supply $V_{DD}$ via a load $R_1$, the output signal of the device being available on the common node of the drain of the transistor and the load $R_1$, and means for connecting the gate of the transistor to a signal whose mean value is suitable for obtaining said drain-source current maximum.

Because the circuit operates around a real maximum (first derivative equals zero) and not in a discontinuity region as in the cited European Patent Application, all circuits have a high stability. Moreover, because for two values of the gate source voltage which are symmetrical with respect to the maximum, a single value of the drain-source current is available instead of two base current values which are stable only on both sides of the resonant point as in the cited European Patent Application, numerous applications are possible, numerical as well as analog, by utilizing the effect in accordance with the invention.

BRIEF DESCRIPTION OF THE DRAWING

The invention will be described in detail hereinafter by way of example with reference to the accompanying diagrammatic drawings; therein

FIG. 5b shows the curve of the output voltage $V_S$ as a function of the gate source voltage $V_E$ in the circuit shown in FIG. 5a;

DESCRIPTION OF THE PREFERRED EMBODIMENTS

Figure 1:
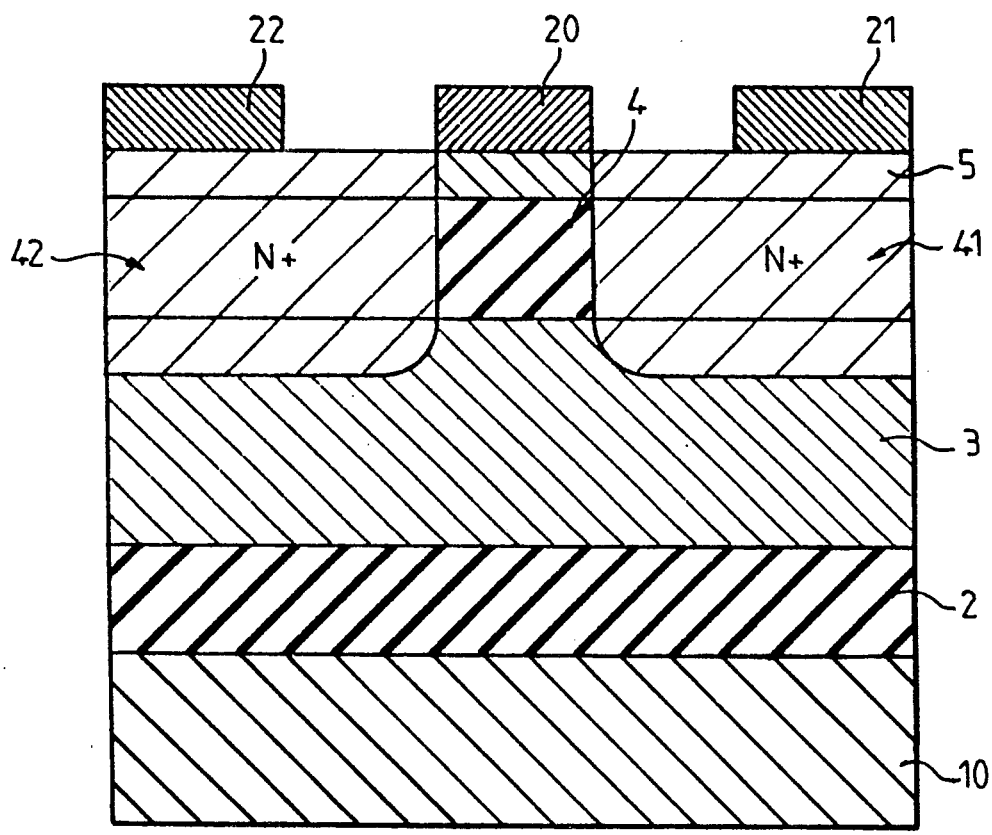
FIG. 1 shows a heterojunction insulated-gate field effect transistor suitable for carrying out the invention.

FIG. 1 shows a heterojunction insulated-gate field effect transistor having a structure which is suitable for carrying out the invention.

As appears from FIG. 1, this transistor comprises, realized on a binary substrate 10, a binary buffer layer 2, followed by a heterostructure which is formed by a non-intentionally doped binary layer 3 on which there is provided a non-intentionally doped ternary layer 4. The structure of this transistor also includes an upper protective layer 5 which is made of a non-intentionally doped binary material.

The binary layers are preferably made of a semiconductor compound of the group III-V, for example gallium arsenide (GaAs) and the ternary layers of a semiconductor compound of the group III-V such as gallium and aluminum arsenide (GaAlAs).

On its upper surface the device is also provided with a gate contact 20 which is made of a metal which is preferably chosen from the refractory metals such as WN or WSi or of a highly doped semiconductor material such as highly doped gallium arsenide.

The device also comprises, on either side of the gate 20, a source electrode 21 and a drain electrode 22 which are realized on highly doped islands 41 and 42 which define the source and drain regions.

A method of realizing such a transistor is known notably from the publication "High Performance WN-gate MISFETs Fabricated from MOVPE Wafers" by M. WOLNY et al in "Electronics Letters, Oct. 8, 1987, Vol. 23, No. 21, pp. 1127-1128".

This document describes a method of realizing a transistor which comprizes a semi-insulating GaAs substrate which is covered by a non-intentionally doped GaAlAs buffer layer. This transistor subsequently comprises a heterostructure which is formed by a non-intentionally doped GaAs layer which has a thickness of approximately 0.6 μm which is covered by a non-intentionally doped GaAlAs layer having a thickness of approximately 40 nm. The latter layer is covered by a thin non-intentionally doped GaAs layer which serves as a protective layer preventing oxidation of the upper layer of the heterostructure. On the surface of the protective layer there is formed a gate contact of a refractory metal WN, on both sides of which N+-type islands define the source and drain regions on which the ohmic source and drain contacts of an Au—Ge—Ni alloy are realized.

This known transistor offers the advantage that it has simple construction and a high performance, which is particularly attractive for carrying out the present invention.

The FIG. 2 show the energy levels of the lower sides of the conduction bands of the various materials constituting the transistors for different values of the d.c. gate biasing voltage $V_{GS}$.

The reference 120 denotes the energy level of the gate metal, the reference 104 that of the ternary material 4, and the reference numeral 103 that of the binary material 3 of the heterojunction. The value $\Delta E_c$ is the energy difference between the lower sides of the conduction bands of the materials 3 and 4 constituting said heterojunction.

Figure 2A:
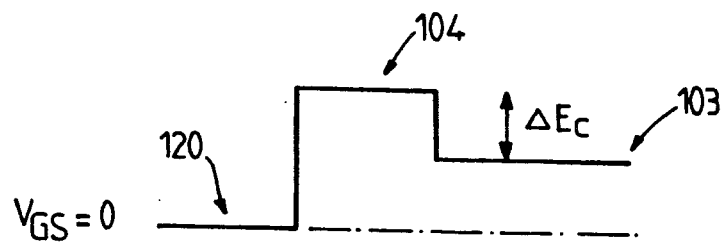
FIGS. 2a to 2c illustrate the energy level in such a transistor during operation.

FIG. 2a shows the energy levels for each of the transistor materials for $V_{GS}=0$. Initially, when the gate biasing voltage $V_{GS}=0$, the Fermi level is in line with that of the metal.

Figure 2B:
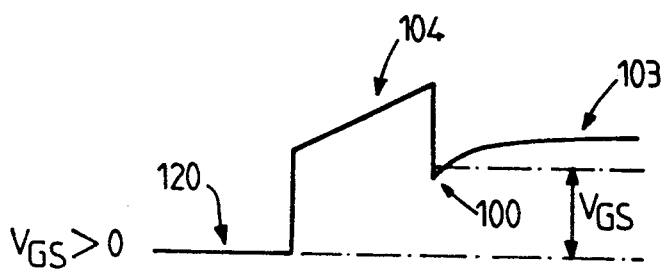

FIG. 2b shows the energy levels when the gate biasing voltage $V_{GS}$ is higher than 0. This Figure shows that the conduction bands are deformed and that a potential well is formed at the point 100. At the point 100 accumulation of a bidimensional electron gas occurs.

Figure 2C:
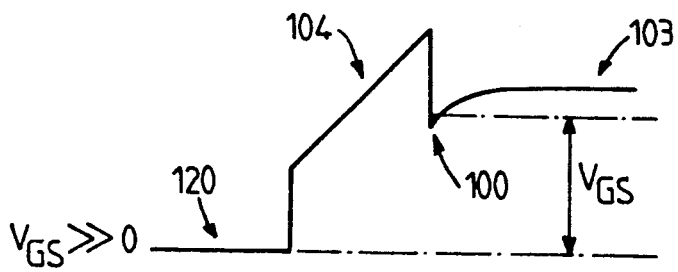

FIG. 2c shows the same bands when the gate biasing voltage $V_{GS}$ becomes very much higher than 0. These bands are then deformed so that the entire voltage is actually present on the terminals of the ternary layer, because the point 100 no longer envolves or envolves only very little. Actually the bidimensional electron gas is entered below the Fermi level. Consequently, the apparent thickness of the ternary layer 4 decreases and a tunnel effect occurs which is added to the thermionic emission at the interface of the two layers 3 and 4 constituting the heterojunction.

Figure 3:
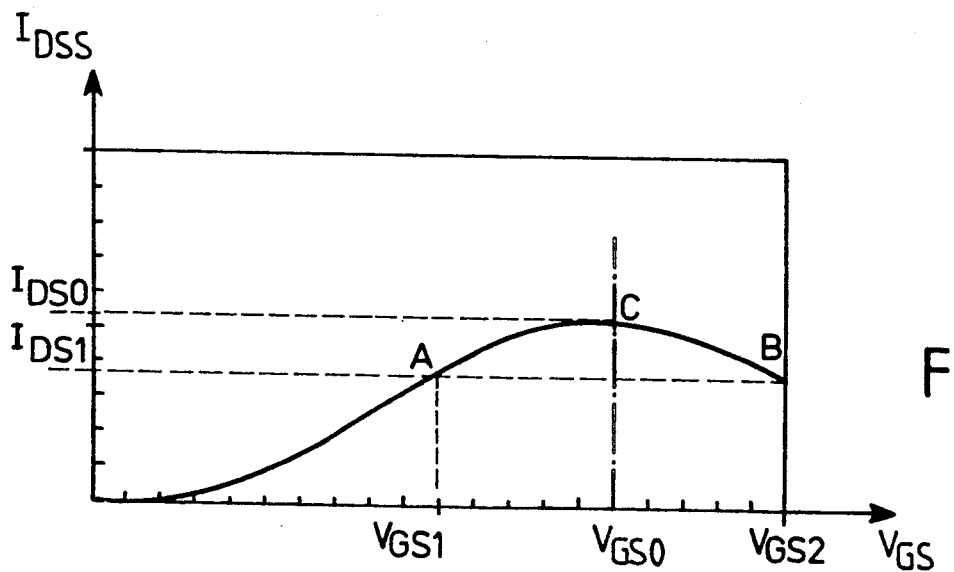
FIG. 3 shows the drain-source current characteristic in the saturation region as a function of the gate-source voltage.

As soon as the bidimensional electron gas exists and a drain-source voltage is applied accelerated carriers become energetic, can overcome the energy barrier $\Delta E_c$ and are collected by the gate. Thus, when the gate is strongly biased by a forward voltage $V_{GS}$, a decrease of the drain current is observed, because when $V_{GS}$ is increased, the apparent barrier for the electrons is lowered and the probability that these electrons overcome the barrier increases strongly. All electrons which escape from the bidimensional electron gas no longer participate in the drain current $I_{DS}$ which, therefore, decreases. Thus, a saturation drain-source current $I_{DSS}$ is obtained as a function of the gate source voltage $V_{GS}$ as shown in FIG. 3. The zone where the current decreases for a voltage $V_{GS}$ higher than a voltage $V_{GSO}$ corresponds to a negative transconductance regime.

The described transistor, illustrated in FIG. 1 and denoted by the reference $T_1$ can be biased in circumstances which are attractive for obtaining the drain-source current maximum which appears prior to the negative transconductance regime.

Hereinafter four examples will be described of the biasing means ensuring that an insulated-gate field effect transistor exhibits, in the case where the gate is biased to a constant high level, a drain-source current characteristic as a function of the gate-source voltage which includes a negative transconductance zone beyond a maximum, on both sides of which the slopes of this smooth characteristic are substantially symmetrical. When the transistor comprises these biasing means, its operating range will be situated in the region of the characteristic which is situated around the maximum, so that two values of the gate-source voltage which are symmetrical with respect to the maximum correspond substantially to the same drain-source current value.

Generally speaking, these biasing means include the direct connection of the source 21 of the insulated-gate field effect transistor $T_1$ to ground, the connection of its drain (22) to a fixed positive d.c. supply $V_{DD}$ via a load $R_l$, the output S of the device being available on the common point of the drain 22 of the transistor $T_1$ and the load $R_l$, and means for connecting the gate (20) of the transistor $T_1$ to a signal whose mean value is suitable for obtaining said drain-source current maximum.

EXAMPLE I

Figure 4A:
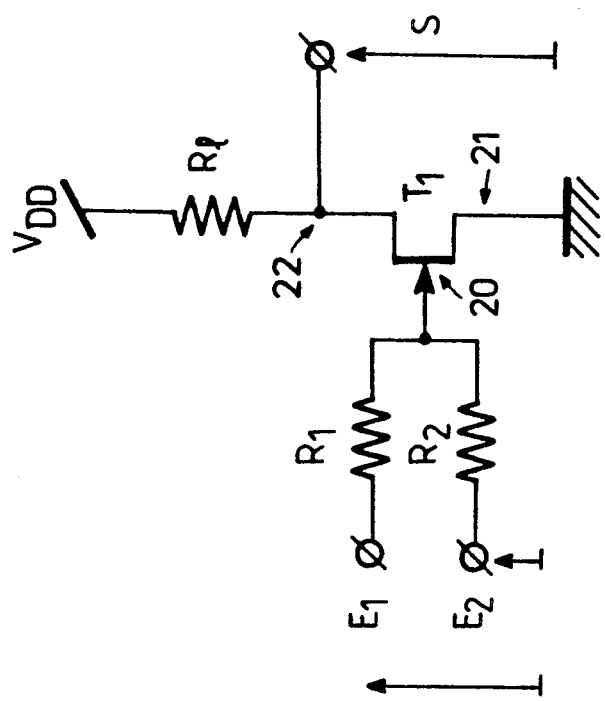
FIG. 4a shows an exclusive-NOR circuit in accordance with the invention.
Figure 4B:
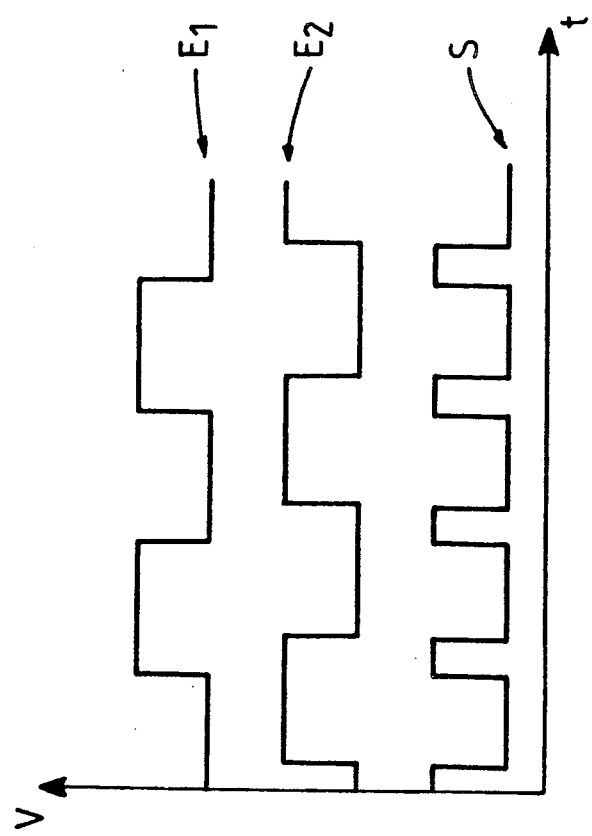
FIG. 4b shows a sequencing of the signals in the exclusive-NOR circuit shown in FIG. 4a, notably the sequencing of the input voltages $E_1$ and $E_2$ and the output voltage S as a function of time t.

This example, illustrated by the FIGS. 4a and 4b, describes the connection means applied to the gate (20) in order to obtain an exclusive-NOR circuit, which connection means are applied in cooperation with the described biasing means.

As appears from the diagram of FIG. 4a, the biasing circuit for obtaining an exclusive-NOR circuit on the basis of an insulated-gate field effect transistor $T_1$ comprises means which ensure that for given values of the voltage applied to the gate the region of the characteristic $I_{DS}$ as a function of $V_{GS}$ is entered which is situated around the maximum C of the curve of FIG. 3.

To this end, as has already been stated and as appears from FIG. 4a, the resistance $R_l$ is arranged between the drain (22) of the transistor $T_1$ and the terminal of the positive d.c. supply voltage $V_{DD}$, the source (21) of the transistor $T_1$ being connected directly to ground.

The input signal is applied to the gate 20 of the transistor $T_1$ and the output signal on its source 22 can be derived from the common node with the load resistance $R_l$.

When a gate-source voltage $V_{GS}$ of increasing value in a domain which is high enough for producing the effect illustrated in FIG. 2c is then applied to the transistor $T_1$, it appears (as shown in FIG. 3) that the saturation drain-source current $I_{DSS}$ starts to increase, passes through a maximum in C and subsequently decreases. The value of the gate-source voltage producing the maximum $I_{DSO}$ of the drain source current in C is referred to hereinafter as $V_{GSO}$.

As appears from FIG. 4a, the exclusive-NOR circuit in accordance with the invention comprises two inputs $E_1$ and $E_2$, each of which is connected to the gate 20 via resistances $R_1$ and $R_2$ preferably of equal value.

FIG. 4b shows the waveform of the digital signals which can be applied to the input $E_1$ and to the input $E_2$ as well as the waveform of the output signals S which can be extracted between the drain and ground.

For carrying out the invention it is essential that the level of the input voltages $E_1$ and $E_2$ is such that the high level (1) and the low level (0) permit the mean voltage value to be the value which is equal to the value $V_{GSO}$ which produces the maximum $I_{DSO}$ in C of the characteristic $I_{DS}$ as a function of $V_{GS}$ as shown in FIG. 3.

As appears from FIG. 4b, when the inputs $E_1=E_2$ are both low (0), this low level also appears on the gate of the transistor $T_1$. Thus, in accordance with the curve of FIG. 3 a given drain-source current ($I_{DS1}$) is obtained (point A of the curve of FIG. 3).

On the other hand, when the inputs $E_1=E_2$ are both high (1), this high level also appears on the gate of the transistor $T_1$. Because of the symmetry around the maximum $V_{GSO}$, the same drain source current $I_{DS1}$ is obtained as when the inputs are both both low. The current $I_{DS1}$ is lower than the maximum of the drain-source current of the curve of FIG. 3 (point B of the curve of FIG. 3).

However, when the input $E_1$ has a state other than the state of the input $E_2$, one being 0 while the other is 1, a voltage equal to $(E_1+E_2)/2$ appears on the gate 20 of the transistor $T_1$, which voltage corresponds to the value $V_{GSO}$, that is to say to the maximum $I_{DSO}$ of the drain-source current (point C of the curve of FIG. 3).

By choosing the levels 0 and 1 of the input voltages $E_1$ and $E_2$ to be symmetrical with respect to the value $V_{GSO}$ which causes the maximum of the curve $I_{DS}$ as a function of $V_{GS}$ of FIG. 3, when $$E_1 = E_2 = 0$$
or
$$E_1 = E_2 = 1$$

$$I_{DS} = I_{DS1} < \text{the maximum } I_{DSO}$$

and when

-continued $$E_1 = 0 \ E_2 = 1$$
or $\quad I_{DS} = I_{DS0}$ maximum
$$E_1 = 1 \ E_2 = 0$$

The output voltage $V_{DS}$ is calculated on the basis of the positive d.c. supply voltage $V_{DD}$ $$V_{DS} = V_{DD} - R_1 \times I_{DS}$$

so, when $I_{DS}$ is maximum, $V_{DS}$ is low (0) and when $I_{DS}$ is smaller than the maximum, $V_{DS}$ is high (1). When S denotes the output signal between the drain and ground, the following logic table is obtained:

TABLE I

| $E_1$ | $E_2$ | S |
|---|---|---|
| 0 | 0 | 1 |
| 1 | 1 | 1 |
| 0 | 1 | 0 |
| 1 | 0 | 0 |

Thus, an equality detector has been formed, or more exactly an exclusive-NOR gate.

This function is in this case realized by means of a single transistor, while in accordance with the present state of the art approximately 8 transistors are used for the same purpose.

In a preferred embodiment where the transistor $T_1$ is a transistor of the type described in the last mentioned publication and shown in FIG. 1
the voltage $V_{DD} = 6$ V
the resistance $R_1 = 3.9$ kΩ
the resistances $R_1 = R_2 = 50$ Ω
the width W of the gate of the transistor $T_1$ is 10 μm
the value of the voltage $V_{GSO} = 2.5$ V
the level 0 for the inputs $E_1$ and $E_2$ is 2 V
the level 1 for the inputs $E_1$ and $E_2$ is 3 V
the level 1 of the output voltage is 3 V
the level 0 of the output voltage is 2 V
the power consumption of the circuit is approximately 5 mW.

EXAMPLE II

With reference to the FIGS. 5a to 5c a description will be given of the connection means applied to the gate for obtaining a circuit for frequency multiplication by two, which means are applied cooperation with the described biasing means.

The input of the stage is realized directly on the gate 20 of the transistor $T_1$ and the output on its drain 22 on the common node with the resisance $R_l$.

As before, when a gate-source voltage $V_{GS}$ of a value which increases in a range where it is sufficiently high to produce the effect illustrated by FIG. 2c is applied to the transistor $T_1$, it appears as shown in FIG. 3 that the saturation drain-source current $I_{DSS}$ starts to increase, passes through a maximum at the point C, and subsequently decreases. The value of the gate-source voltage which produces the maximum $I_{DSO}$ at the point C of the drain source current is denoted as $V_{GSO}$ hereinafter.

Figure 5B:
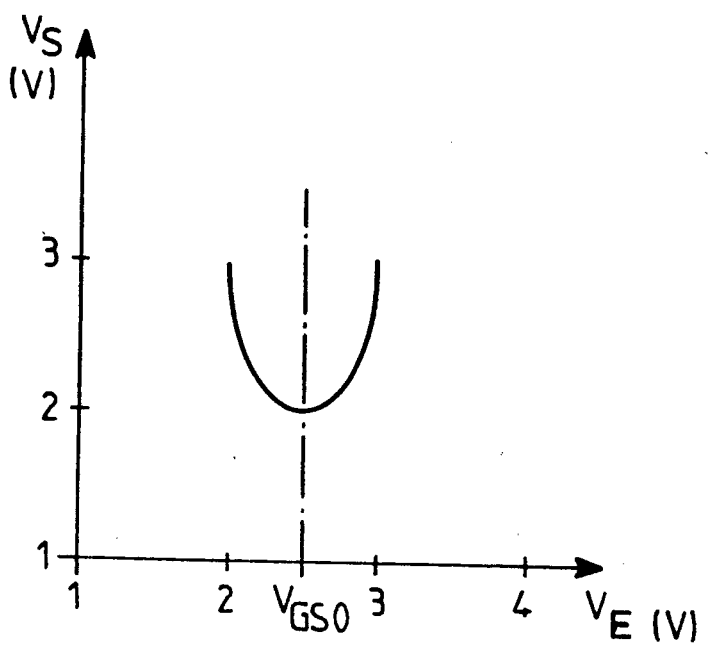
Figure 5A:
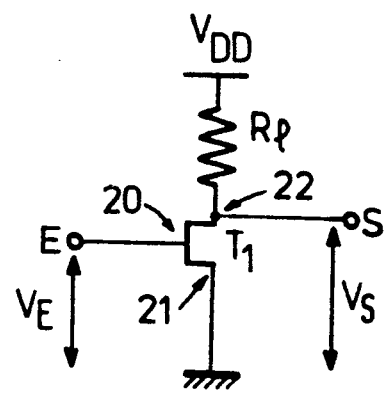
FIG. 5a shows a diagram of a frequency multiplier in accordance with the invention.
Figure 5C:
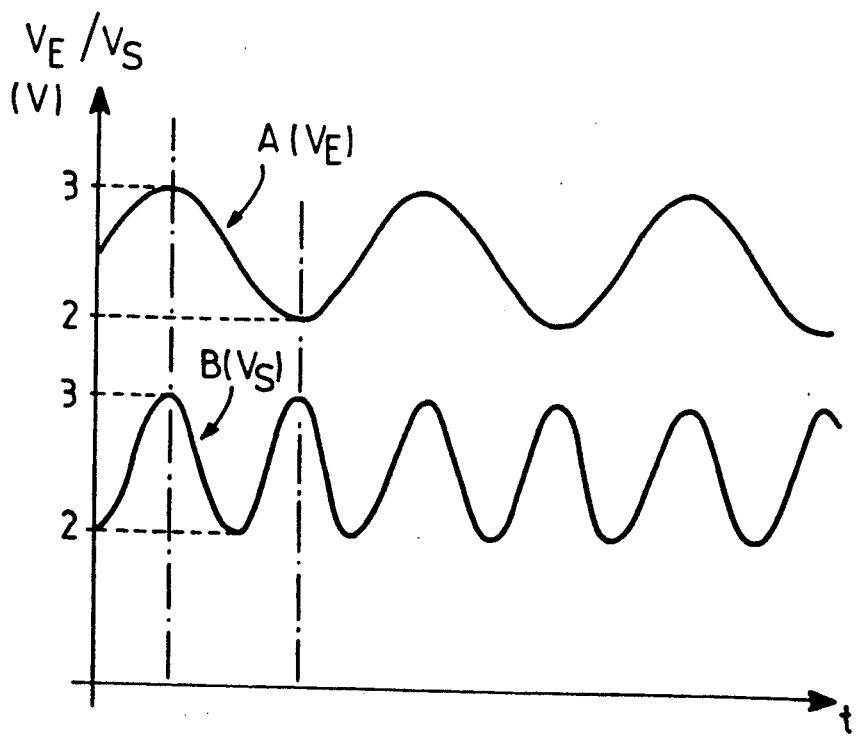
FIG. 5c shows the waveform of the output signal obtained in the device shown in FIG. 5a when a sinusoidal signal is applied to the input, that is the gate of the transistor.

FIG. 5b shows the variations of the output voltage $V_S$ extracted between the drain 22 of the transistor $T_1$ and ground as a function of the voltage $V_E$ applied between the gate 20 of the transistor $T_1$ and ground for the circuit shown in the diagram of FIG. 5a. FIG. 5b shows that, when the input voltage $V_E$ reaches the value $V_{GSO}$, the output voltage $V_S$ passes through a minimum. Actually, the output voltage is expressed as a function of the current $I_{DS}$ by the following relation:

$$V_S = V_{DD} - R_l I_{DSS}$$

The positive d.c. supply voltage $V_{DD}$ as well as the value of the load resistance $R_l$ being fixed, when for $V_{GSO}$ the current $I_{DS}$ passes through a maximum (see FIG. 3), the output voltage $V_S$ passes through a minimum (see FIG. 5b).

When the input of the circuit shown in FIG. 5b receives an analog voltage $V_E$, for example a high frequency signal having a frequency F whose waveform is represented by the curve A of FIG. 5c, during a half-period in which the voltage $V_E$ increases, the value of the output voltage $V_S$ then decreases and subsequently increases. During the second half-period the voltage $V_E$ decreases and successively assumes the same values as during the first half-period; thus the output voltage $V_S$ decreases and subsequently increases again.

If the d.c. component of the input signal $V_E$ is suitably centered around the voltage $V_{GSO}$ which produces a maximum of the saturation drain source current characteristic $I_{DSS}$ as a function of the gate source voltage $V_{GS}$ in C, the circuit shown in FIG. 5a constitutes a perfect frequency doubler.

This circuit has many advantages. It is notably realized by means of a single active component. This active component operates at ambient temperature. The output signal having the frequency 2F, that is to say twice the frequency F of the input signal, is pure. It does not necessitate a filtering operation. It utilizes the negative transconductance effect which occurs for the described transistor in the case of strong gate biasing and the smooth transistor characteristic.

In a preferred embodiment where the transistor $T_1$ is a transistor of the type described in the last-mentioned publication and shown in FIG. 1:
the voltage $V_{DD} = 6$ V
the resistance $R_l = 3.9$ kΩ
the width W of the gate of the transistor $T_1$ is 10 μm
the value of the voltage $V_{GSO} = 2.5$ V
the amplitude of the d.c. component of the input signal $V_E$ is between 2 V and 3 V and so is that of the signal $V_O$
the experimental frequency F was F = 500 kHz.

EXAMPLE III.

A description will be given with reference to the FIG. 6 of the means applied in order to obtain a phase modulator, which means are applied in cooperation with the already described biasing means.

FIG. 3 shows that for a value $V_{GS} = V_{GS1}$ (point A of FIG. 3) the transconductance is positive and equal to $gm_o$. On the other hand, for a value $V_{GS} = V_{GS2}$ (point B of FIG. 3), the transconductance has the same absolute value $gm_o$ as a the point A, but is negative.

The value of the output voltage $V_S$ is given by:

$$V_S = V_{DO} - R_l I_{DS}.$$

For a small signal in the saturation region; the following can be written:

$$v_s = R_l \cdot i_{ds} = -R_l gm \cdot v_e$$

where $v_s$ is the amplitude of the small signal derived from the output and $v_e$ is the amplitude of the small signal applied to the input. In the first case where $$V_{GS}=V_{GS1}, v_s/v_e=-R_l \cdot gm_o \quad (1)$$

and in the case where
$$V_{GS}=V_{GS2}\ v_s/v_e=R_l \cdot gm_o \quad (2)$$

If the input signal $v_e$ is: $v_e = a \sin \omega t$, where a is a constant, the expressions (1) and (2) produce the following expressions (1') and (2'), where $\Phi$ is a phase shift:

$$v_s=a \cdot R_l \cdot gm_o \cdot \sin(\omega t+\Phi), \text{ where } \Phi=180° \quad (1')$$

$$v_s/v_e=-a \cdot R_l \cdot gm_O \quad (2')$$

where a is a constant.

Thus, in $V_{GS1}$ (A) a small signal $v_e$ applied to the input on the carrier $V_{GS}$ is amplified by $R_l \cdot gm_o$ and in $V_{GS}$ (B) a small signal $v_e$ applied to the input on the carrier $V_{GS}$ is amplified by $-R_l \cdot gm_o$, that is to say amplified by $R_l \cdot gm_o$ and phase shifted through 180°.

This property of the circuit shown in FIG. 5a is used for the realization of a phase modulator as shown in FIG. 6a. In this case it concerns the modulation of a signal having the frequency Fo by a digital signal N by associating a phase $\Phi_1$ with the modulated output signal S when the digital signal $N=0$ and a phase $\Phi_2$ when the digital signal $N=1$.

Figure 6:
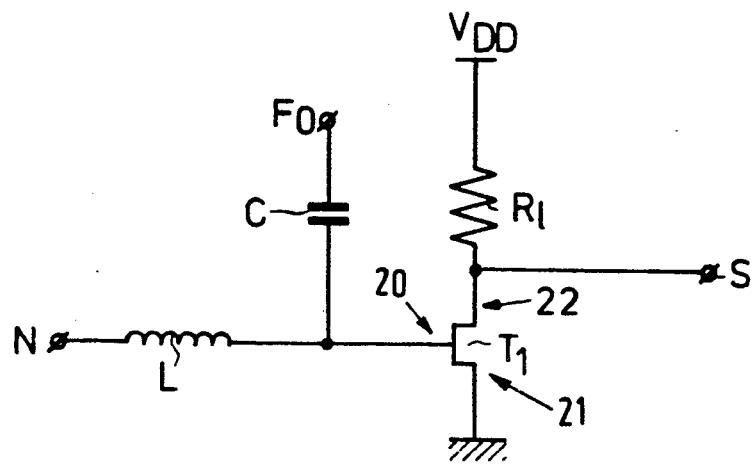
FIG. 6 shows a phase modulator.

The diagram of FIG. 6 shows that this object is achieved by applying the digital signals N and the analog signals of the frequency Fo to the gate 20 of the transistor $T_1$ by means of an element which is referred to as a "T biasing element".

The digital signal N is applied to one end of an inductance L whose other end is connected to the gate 20. The analog signal of the frequency Fo is applied to one end of a capacitance C whose other end is connected to the gate 20.

The phase modulation of the signal having the frequency $F_o$ is obtained when the states of the digital signal correspond to $$N=0 \text{ for } V_{GS}=V_{GS1}$$

$$N=1 \text{ for } V_{GS}=V_{GS2}.$$

In a preferred embodiment for modulating a signal having the frequency Fo=2 GHz, this circuit is realized using the following elements:
$L=5$ nH
$C=12$ pF
$R_1=3.6$ k$\Omega$
$W=10$ $\mu$m
$V_{DD}=5$ V
$V_{GS1}=1.5$ V
$V_{GS2}=2.5$ V.

EXAMPLE IV.

Figure 7:
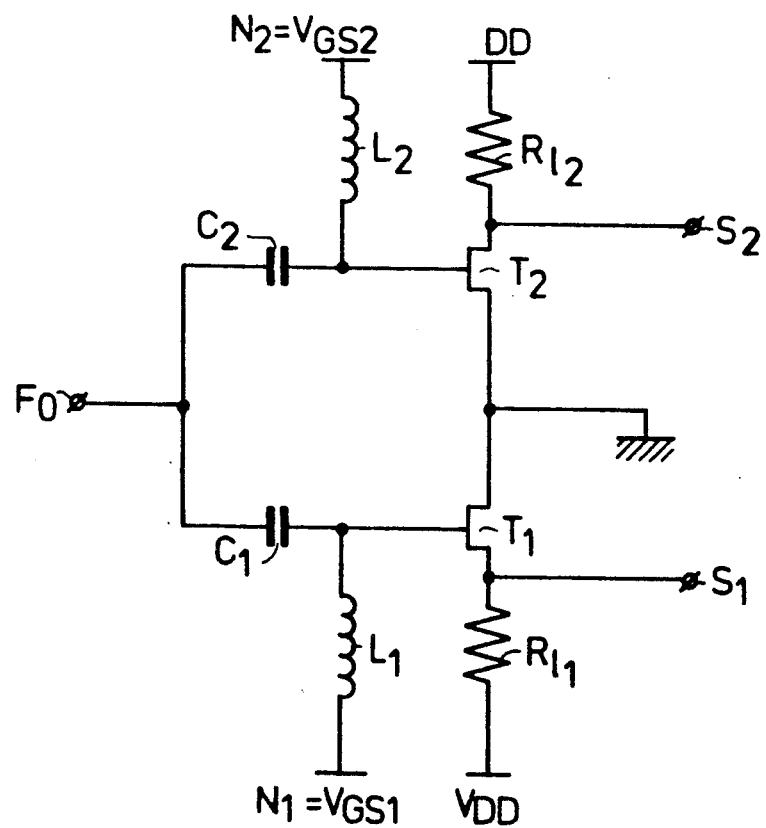
FIG. 7 shows a 0°-180° phase shifter.

This example, illustrated by FIG. 7, relates to the properties of the circuit shown in FIG. 5a which are explained in the example III and proposes the application of these properties to the realization of 0°-180° phase shifter.

Such a function is obtained by means of the circuit shown in FIG. 7. The circuit of FIG. 7 comprises two circuits in accordance with the circuit shown in FIG. 6. Each of the circuits receives, on the input N at the end of the inductance L, a different gate-source biasing voltage $V_{GS}$.

One circuit will receive on its input $N_1$:
$V_{GS}=V_{GS1}=$fixed
The other circuit will receive on its input $N_2$:
$V_{GS}=V_{GS2}=$fixed.
The two circuits are connected by the end of the capacitance C which receives the small signal of the frequency Fo.

Each of the biasing voltages $V_{GS1}$ and $V_{GS2}$ is associated with a respective transconductance $gm_o$ of the same absolute value but of mutually different signs.

The outputs $S_1$ and $S_2$ which are available on the drains of the transistors $T_1$ and $T_2$ of the two associated circuits will be phase shifted 180° with respect to one another.

In a preferred embodiment for an input signal having the frequency Fo=2 GHz, the following elements will be used:
$L_1=L_2=5$ nH
$C_1=C_2=12$ pF
$R_{12}=R_{12}=3.9$ k$\Omega$
$W_1=W_2=10$ $\mu$m
$V_{DD}=6$ V
$N_1=V_{GS1}=1.5$ V
$N_2=V_{GS2}=2.5$ V
$\Psi_1=0°$ for $S_1$
$\Psi_2=180°$ for $S_2$.

The transistors described in the cited publications as being suitable for carrying out the invention are not the only transistors showing a negative transconductance effect.

Actually, any transistor which is of the field effect type (unipolar) and comprises an insulated gate may be used for realizing circuits in accordance with the examples I to IV. Generally speaking, when a high voltage $V_{GS}$ is applied to the gate of one of these transistors, a characteristic $I_{DS}$ is obtained as a function of $V_{GS}$ which exhibits a maximum (first derivative equal to zero), on both sides of which the slopes of the curve are substantially symmetrical so that a single value of the current $I_{DS}$ corresponds to two values of $V_{GS}$ which are symmetrical with respect to the maximum. The source can be connected to ground and the drain can be coupled to a positive supply voltage $V_{DD}$ in order to ensure that the circuit operates in the region around the maximum.

Examples of field effect transistors which can be used are:

a) The Metal Oxide Semiconductor Field Effect Transistors (MOSFETs). In this type of transistor, usually realized on silicon, the gate is metallic and insulated from the active layer by an oxide layer. The negative drain conductance can be realized because the electrons leaving the active layer traverse the oxide layer by the tunnel effect and are captured by the gate when the latter is biased to a suitable level $V_1$.

b) The Heterostructure Insulated Gate Field Effect Transistors (HIGFETs). In this type of transistor, generally realized of materials III-V, the gate is insulated from the active layer by a layer which forms a heterostructure with the active layer. In this category there are various sub-groups of transistors which enable the invention to be carried out:

transistors whose substrate is *semi-insulating*. In this case the negative drain conductance effect occurs because the electrons from the bidimensional electron gas (see above) are captured by the gate;

transistors whose substrate is *conductive*, for example made of a doped semiconductor material (for example, $N^+$-doped). In this case the negative drain conductance is realized by the emission of hot electrons *towards* the conductive substrate and not towards the gate.

For this group of HIGFETs, the gate of the field-effect transistors can be realized in two different ways. The gate may be metallic for the MISFETs (Metal Insulator Semiconductor Field Effect Transistor) or the gate itself may be made of a semiconductor material for the SISFETs (Semiconductor Insulator Semiconductor Field Effect Transistor).

For the hot electrons, the material constituting the gate is actually indifferent and the effect is not changed.

It will be noted that in the entire foregoing description, it has not been stated that the transistors comprising a quantum well as known from said EP 0 225 698 are also suitable for carrying out the invention.

The previously described faults which are inherent in this type of transistor relate notably to the existence of the discontinuity so that a maximum defining two symmetrical parts of the curve cannot be obtained. Consequently, the quantum well transistors are only suitable for obtaining two stable base current values (stable but not identical) on both sides of the resonant point defined by the base-emitter voltage. Therefore, the applications are limited not only by the complexity of the device (ultra-thin layers etc.) and by its operating temperature (77° K.), but also by the lack of symmetry and smoothness of the characteristic.

Essential for carrying out the invention are the occurrences of both a positive and a negative transconductance in an insulating gate field effect transistor irrespective of the transistor's conductivity type (P or N).

We claim:

1. An integrated semiconductor device, including an insulated-gate field effect transistor biased to a constant level, characterized in that the transistor has a drain-source current characteristic as a function of gate-source voltage which exhibits a negative transconductance zone beyond a maximum, a slope of the characteristic on each side of said maximum being substantially symmetrical so that two values of the gate-source voltage which are symmetrical with respect to said maximum correspond substantially to the same value of the drain-source current, and in that the transistor comprises biasing means for ensuring that its operating zone is situated in a region of said characteristic around said maximum.

2. A device as claimed in claim 1, characterized in that said biasing means include the direct connection of the source of the transistor to a first d.c. supply voltage, the connection of the drain of the transistor to a fixed second d.c. supply voltage via a load $R_1$, an output signal of a device being available on the common node of the drain of the transistor and the load, and means for connecting the gate of the transistor to a signal whose mean value is suitable for obtaining said drain-source current maximum.

3. A device as claimed in claim 2, characterized in that for realizing an digital exclusive-NOR circuit the gate connection means comprises a first resistance which is arranged between a first input $E_1$ for a first signal and the gate, and a second resistance which is arranged between a second input $E_2$ for a second signal and the gate, the first and the second resistance having the same value, values of voltages of the input signals $E_1$ and $E_2$ for the logic levels 0 and 1 being symmetrical with respect to a value of the gate-source voltage which generates the drain-source current maximum.

4. A device as claimed in claim 2, characterized in that for realizing a frequency doubler circuit the gate of the field effect transistor is connected to an input E for an alternating signal which is carried by a d.c. voltage whose value is suitable for obtaining the drain-source current maximum.

5. A device as claimed in claim 2, characterized in that in order to obtain a phase modulator, the gate connection means comprise an L-C element which is referred to as a "T biasing element" and which includes an inductance L arranged between the gate and an input $E_1$ for an input voltage whose logic levels 0 and 1 are symmetrical with respect to a value of the gate-source voltage generating the drain-source current maximum, and also includes a capacitance C which is arranged between the gate and an input $E_2$ for an alternating signal having a frequency Fo which is produced by a phase shift between output signals corresponding to a state 0 and 1, respectively.

6. An integrated semiconductor device, characterized in that in order to realize a 0°–180° phase shifter the device comprises two symmetrical circuits as claimed in claim 5, one of which receives on its input $E_1$ for the signal, a voltage which corresponds to the level 0, the other circuit receiving, on its input $E'_1$, a voltage which corresponds to the level 1, the inputs $E_2$ for the alternating signal being coupled, the output signals in phase opposition being available on the drains of the transistors of the two circuits.

7. A device as claimed in claim 1, characterized in that the insulating layer of the gate constitutes a heterostructure in conjunction with the layer forming the channel of the insulated-gate field effect transistor.

8. A device as claimed in claim 7, characterized in that the gate of the insulated-gate field effect transistor is metallic.

9. A device as claimed in claim 7, characterized in that the gate of the insulated gate field effect transistor is made of a semiconductor material.

10. A device as claimed in claim 7, characterized in that the substrate of the insulated-gate field effect transistor is semi-insulating.

11. A device as claimed in claim 7, characterized in that the substrate of the insulated gate field effect transistor is conductive and comprises a doped semiconductor material.

* * * * *